(12) United States Patent
Shim et al.

(10) Patent No.: US 6,706,563 B2
(45) Date of Patent: Mar. 16, 2004

(54) HEAT SPREADER INTERCONNECT METHODOLOGY FOR THERMALLY ENHANCED PBGA PACKAGES

(75) Inventors: Il Kwon Shim, Singapore (SG); Hermes T. Apale, Singapore (SG); Gerry Balanon, San Jose, CA (US)

(73) Assignee: ST Assembly Test Services PTE LTD, Singapore (SG)

( * ) Notice: Subject to any disclaimer, the term of this patent is extended or adjusted under 35 U.S.C. 154(b) by 0 days.

(21) Appl. No.: 10/119,920

(22) Filed: Apr. 10, 2002

(65) Prior Publication Data

US 2003/0197195 A1 Oct. 23, 2003

(51) Int. Cl.$^7$ ................................. H01L 21/44
(52) U.S. Cl. ................ 438/125; 438/122; 438/123; 438/124; 438/126; 438/127; 257/675; 257/688; 257/706; 257/707; 257/796
(58) Field of Search .................. 438/22, 24, 117, 438/122–127; 257/81, 99, 177–181, 584, 625, 675, 688, 689, 705–707

(56) References Cited

U.S. PATENT DOCUMENTS

| | | | |
|---|---|---|---|
| 5,409,865 A | 4/1995 | Karnezos | 437/210 |
| 5,641,987 A | 6/1997 | Lee | 257/675 |
| 5,736,785 A | 4/1998 | Chiang et al. | 257/712 |
| 5,834,839 A | 11/1998 | Mertol | 257/704 |
| 5,872,395 A | 2/1999 | Fujimoto | 257/675 |
| 5,977,626 A | 11/1999 | Wang et al. | 257/707 |
| 6,020,637 A | 2/2000 | Karnezos | 257/738 |
| 6,201,301 B1 | 3/2001 | Hoang | 257/712 |
| 6,251,707 B1 | 6/2001 | Bernier et al. | 438/122 |
| 6,278,613 B1 * | 8/2001 | Fernandez et al. | 361/719 |
| 6,462,405 B1 * | 10/2002 | Lai et al. | 257/675 |
| 6,552,428 B1 * | 4/2003 | Huang et al. | 257/706 |
| 2003/0057545 A1 * | 3/2003 | Shim et al. | 257/706 |

* cited by examiner

*Primary Examiner*—David Nelms
*Assistant Examiner*—Andy Huynh (57) ABSTRACT

A new method is provided for the interface between a heat spreader and the substrate of a thermally improved PBGA package. The heat spreader interfaces with the substrate with the standoff of the heat spreader. The stand-off of the heat spreader is provided with an opening, the stand-off of the heat spreader is aligned with the substrate of the PBGA package by means of a copper pad that is provided over a second surface of the substrate. A gold stud bump or a solder bump are further provided over the surface of the copper pad for alignment purposes. Thermally conductive epoxy or solder is deposited over the opening of the heat spreader and therewith over the copper pad provided over a second surface of the substrate. Under an additional embodiment of the invention, extremities if the heat spreader stand-off are aligned with contact pads provided over the second surface of the substrate of the package, thermally conductive epoxy is deposited over the contact surfaces between the extremities and the contact pads.

36 Claims, 5 Drawing Sheets

HEAT SPREADER INTERCONNECT METHODOLOGY FOR THERMALLY ENHANCED PBGA PACKAGES

BACKGROUND OF THE INVENTION (1) Field of the Invention

The invention relates to the fabrication of integrated circuit devices, and more particularly, to a method and package for thermally improved Plastic Ball Grid Array (PBGA) packaging.

(2) Description of the Prior Art

The semiconductor industry has since its inception achieved improvements in the performance of semiconductor devices by device miniaturization and by increasing the device packaging One of the original approaches that has been used to create surface mounted, high pin count integrated circuit packages has been the use of the Quad flat Pack (QFP) with various pin configurations. For the QFP, closely spaced leads along the four edges of the flat package are used for making electrical connections from where the electrical connections are distributed to the surrounding circuitry. The input/output (I/O) connections that can be made to the QFP are therefore confined to the edges of the flat package, which limits the number of I/O connections that can be made to the QFP even in applications where the pin to pin spacing is small. The QFP has found to be cost effective for semiconductor devices where the device I/O pin count does not exceed 200. To circumvent this limitation, a new package, a Ball Grid Array (BGA) package has been introduced. For the BGA package, the electrical contact points are distributed over the entire bottom surface of the package thereby eliminating the restriction of having I/O connects only around the periphery of the package. More contact points with greater spacing between the contact points can therefore be allocated across the BGA package than was the case with the QFP. The contact points that are used for the BGA package are typically solder balls that have the added advantage of facilitating flow soldering of the package onto a printed circuit board.

Prior Art substrate packaging uses ceramic and plastic BGA packaging. Ceramic substrate packaging is expensive and has proven to limit the performance of the overall package. Recent years have seen the emergence of plastic BGA packaging; this packaging has become the main stream design and is frequently used in high volume BGA package fabrication. The Plastic substrate BGA (PBGA) package performs satisfactorily when used for low-density flip-chip IC's. If the number of pins emanating from the IC is high, that is in excess of 350 pins, or if the number of pins coming from the IC is less than 350 but the required overall package size is small, or if the chip power dissipation is high (in excess of 4 Watts per chip), the plastic structure becomes complicated and expensive.

The invention addresses concerns of thermal performance of the PBGA package that in addition provides advantages of electrical performance (such as low parasitic inductance being added by the package) and advantages of assembly (such as low cost, being a flexible solution that does not require a redesign of the substrate over which the die is mounted) while the package meets conventional manufacturing standards.

U.S. Pat. No. 5,372,396 (Fujimoto) shows a heat spreader using a mold compound and a mold cavity.

U.S. Pat. No. 5,641,987 (Lee) shows another similar heat spreader design.

U.S. Pat. No. 5,977,626 (Want et al.) U.S. Pat. No. 6,201,301 (Hoang) and U.S. Pat. No. 5,834,839 (Mertol) show related heat spreaders and methods.

A principle objective of the invention is to provide a semiconductor package of improved thermal and electrical conductivity by using conductive epoxy combined with solder ball interconnects to connect between a heat spreader and a ground pad of the package substrate.

Another objective of the invention is to provide a semiconductor package with improved heat spreader planarity.

Yet another objective of the invention is to provide a semiconductor package having direct contact between a heat spreader of the package and a substrate of the package.

In accordance with the objectives of the invention a new method is provided for the interface between a heat spreader and the substrate of a thermally improved PBGA package. The heat spreader interfaces with the substrate with the stand-off of the heat spreader. Under a first embodiment of the invention, the stand-off of the heat spreader is provided with an opening, the stand-off of the heat spreader and therewith the heat spreader is aligned with the substrate of the PBGA package by means of a copper pad that is provided over a second surface of the substrate. Thermally conductive epoxy is deposited over the opening of the heat spreader and therewith over the copper pad provided over a second surface of the substrate.

Under a second embodiment of the invention, the stand-off of the heat spreader is provided with an opening, the stand-off of the heat spreader and therewith the heat spreader is aligned with the substrate of the PBGA package by means of a gold bump or stud that is provided over a second surface of the substrate. Thermally conductive epoxy is deposited over the opening of the heat spreader and therewith over the gold bump or stud provided over a second surface of the substrate.

Under a third embodiment of the invention, the stand-off of the heat spreader is provided with an opening, the stand-off of the heat spreader and therewith the heat spreader is aligned with the substrate of the PBGA package by means of a ground pad over which a solder ball is provided over a second surface of the substrate. Thermally conductive epoxy is deposited over the opening of the heat spreader and therewith over the ground pad and the thereover created solder ball provided over a second surface of the substrate.

Under a fourth embodiment of the invention, the standoff of the heat spreader and therewith the heat spreader is aligned with a copper ground pad provided over a second surface of the substrate. Thermally conductive epoxy is deposited over an extremity of the standoff of the heat spreader and therewith over the exposed surface of the copper pad provided over a second surface of the substrate.

DESCRIPTION OF THE PREFERRED EMBODIMENTS

Figure 1:
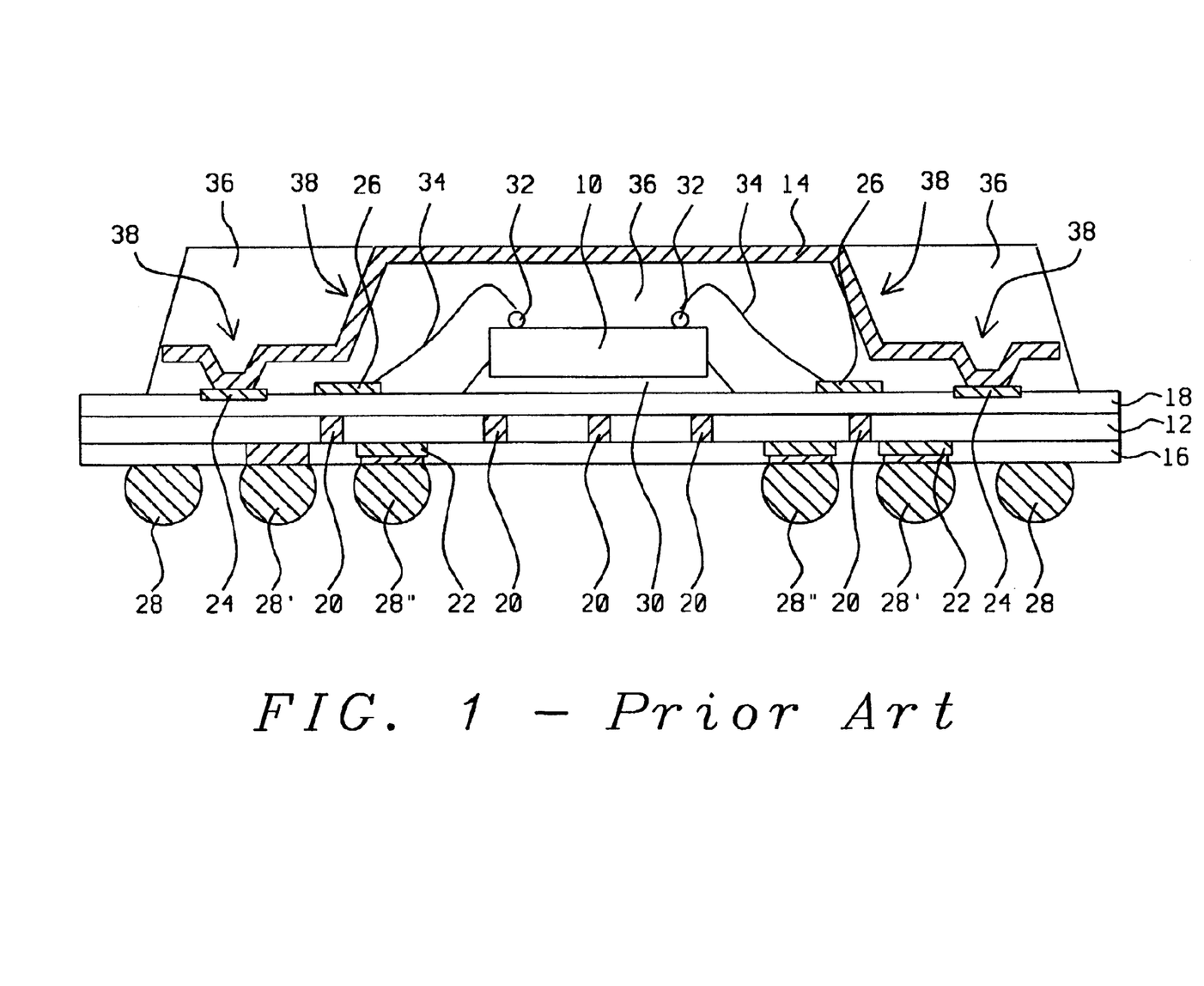
FIG. 1 shows a cross section of a conventional thermally enhanced PBGA package, specifically highlighting conventional methods of heat spreader interconnect.

The prior art heat spreader interconnect methodology for thermally enhanced PBGA package is shown in cross section in FIG. 1 as an example of a die-up mounting method. For applications where the die-up method of mounting the device does not meet thermal requirements, the die-down method is frequently used whereby substrates are used that have been provided with metal heat-distribution surfaces (heat slugs). A die-down BGA package typically has better thermal performance than the die-up PBGA package since the heat that is generated in the die can be dissipated effectively from the backside of the die to the metal heat slugs. However, the assembly cost for this die-down arrangement is considerably higher than for the die-up method of mounting semiconductor devices.

Shown in the cross section of FIG. 1 are the following elements of a die-up thermally enhanced PBGA package:

10, the semiconductor die of the thermally enhanced PBGA package, mounted over the surface of substrate 12

12, a substrate or semiconductor die mounting support; it must be understood that conventionally substrate 12 is used for the creation of multiple, complex and overlying layers of interconnect traces; these interconnect traces have not been highlighted in the cross section of FIG. 1 and essentially connect contact points or contact pads that are provided over a first surface of substrate 12 with contact points or contact pads that are provided over a second surface of substrate 12; examples of contact pads over a first surface of substrate 12 have been provided with contact pads highlighted as 22, examples of contact pads over a second surface of substrate 12 have been provided with contact pads highlighted as 24 and 26

14, the heat sink of the package 16, a first solder mask layer, typically comprising a patterned and etched layer of dielectric, with openings that align with the contact pads 22; first solder mask 16 is created over a first surface of substrate 12

18, a second solder mask layer, typically comprising a patterned and etched layer of dielectric, with openings that align with the copper traces 24; second solder mask 18 is created over a second surface of substrate 12

20, interconnect vias provided through substrate 12, creating electrical interconnects between contact pad on a first surface of substrate 12 and contact pad on a second surface of substrate 12

22, conductive traces or contact pads on a first surface of substrate 12, conductive traces 22 are connected to traces 26 by means of vias 20 or by means of other interconnect traces (not shown) that are part of the substrate 12

24, ground pads provided over a second surface of substrate 12, these ground pads 24 are the physical interfaces between the heat spreader 14 and the substrate 12

26, contact points provided over the second surface of substrate 12

28, solder balls for further interconnect (not shown) of the package that is shown in cross section in FIG. 1 with surrounding electrical circuitry or electrical components (not shown); of the solder balls that are shown in the cross section of FIG. 1, it must be noted that some of these solder balls, such as solder ball 28, do not penetrate through the layer 16 and therefore do not make direct electrical contact with points of electrical contact provided in or on the first surface of substrate 12; other solder balls, such as solder ball 28' completely penetrate through the solder mask 16 and therefore make contact with conductive traces (not shown) over the surface of the substrate 12; other solder balls again, such as solder balls 23", partially penetrate through the solder mask 16 and make contact with contact pads 22 provided over a first surface of substrate 12

30, a layer of thermally conductive adhesive interfacing between die 10 and the second surface of substrate 12

32, points of electrical contact provided over the active surface of semiconductor die 10

34, bond wires for the interconnection of die 10 to contact pads 26 provided over a second surface of substrate 12

36, a mold compound formed over the surface of the structure, which further also surrounds bond wires 34.

Conventional methods that are applied for the improvement of thermally enhanced PBGA packages concentrate on:

increasing the density of the copper that is used in the creation of the substrate of the package including an increasing number of metal layers in the substrate of the package applying methods of enhanced integration of the heat spreader of the package into the package, typically using an adhesive for this purpose increasing the thickness of the metal layers in the substrate of the package, and adding more thermally conductive parts, vias and solder balls to the substrate of the package, specifically to surface areas of the substrate that align with the thereover mounted semiconductor die of the package.

Specifically highlighted in the cross section of FIG. 1 are the heat spreader standoff features 38 of the heat spreader, which form the surfaces and method of interfacing the heat spreader 14 with the substrate 12 of the PBGA package. Heat spreader 14 may comprise metal or may comprise thermally conductive epoxy.

The interconnect methodology of the invention will now be described in detail using the cross sections of FIGS. 2 through 5b. This description will specifically concentrate on the methods in which the heat sink of a thermally enhanced PBGA package interfaces with and is aligned with the substrate of the package, an interface that for conventional PBGA packages has been highlighted as the stand-off 38 of FIG. 1.

Figure 2A:
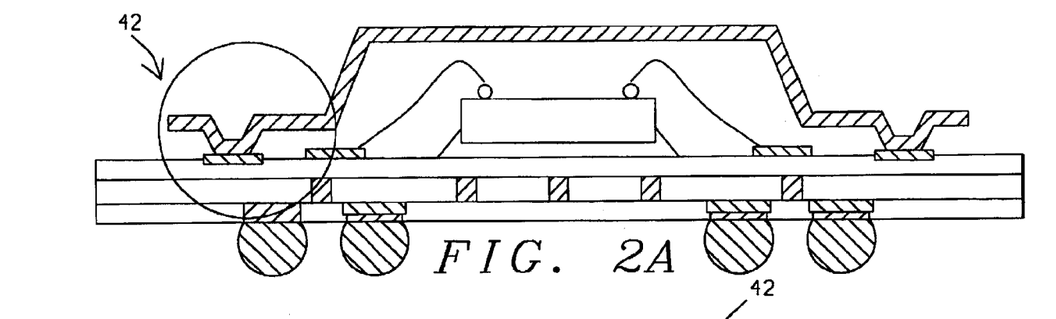
FIGS. 2a and 2b show a cross section of a first PBGA package of the invention, whereby the heat spreader is aligned by means of a copper pad provided over a second surface of the substrate.
Figure 2B:
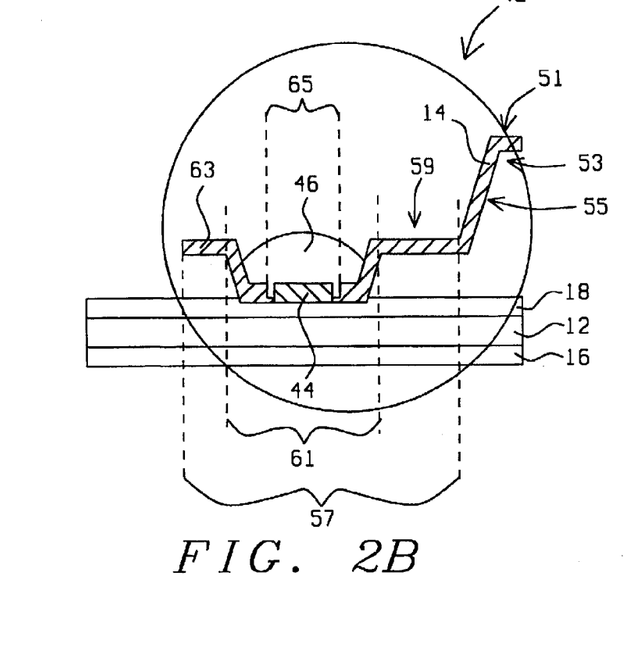

Specifically referring now to the cross sections of FIGS. 2a and 2b, there is shown a first interconnect methodology of a thermally enhanced PBGA package 40. The physical interface 42 between the heat sink 14 and the substrate 12 is referred to as the standoff 42 of the heat spreader 14. The standoff 42 has been shown in magnified form in order to highlight the following details of interconnect 42:

44, a copper pad that is provided over a second surface of substrate 12, which at least partially penetrates through the solder mask 18 in order to establish firm mechanical interface between the heat sink 14 and substrate 12

46, conductive epoxy provided overlying copper pad 44

51, a horizontal section of the heat spreader 14

53, an upper section of the stand-off section 42 of the heat spreader 14

55, a center section of the stand-off section 42 of the heat spreader 14

57, a lower section of the stand-off section 42 of the heat spreader 14, the lower section 57 of the heat spreader stand-off 42 comprises, progressing in a direction away from the horizontal section 51 of the heat spreader 14:

59, a first horizontal section being parallel with the surface of the substrate 12, followed by 61, a U-shaped extrusion with a lower side of the U-shaped extrusion facing the substrate and with the two remaining sides of the U-shaped extrusion interfacing with the surface of the substrate under an angle, followed by 63, a second horizontal section being connected to the U-shaped extrusion, the second horizontal section being parallel with the surface of the substrate 12, and 65, an opening that has been created through the bottom layer of the U-shaped extrusion 61, overlying the copper pad 44.

Additional elements that are shown in the cross sections of FIGS. 2a and 2b but that have not been highlighted will be recognized as being identical to the corresponding elements that have previously been highlighted in the cross section of FIG. 1. Because of this partial identity between the cross sections of FIGS. 2a and 2b and FIG. 1, these elements will for reasons of avoidance of repetition and for reasons of simplicity of presentation not be repeated at this time. These elements are included in the description of the cross section of FIGS. 2a and 2b by reference to the cross section of FIG. 1.

Not highlighted in the cross sections of FIGS. 2a and 2b are the layers of mold compound that are applied to mount the semiconductor die over the surface of the substrate and to thereby further complete the package of the semiconductor die. These layers of mold compound have been highlighted as layer 36 in the cross section of FIG. 1, the layer of mold compound 36 that underlies the heat sink 14 is a first (applied) layer of mold compound, the layer of mold compound that overlies the heat sink 14 is a second (applied) layer of mold compound. For the completion of the thermally enhanced PBGA package of the invention, these layers of mold compound are assumed to also be The applied mold compound can be cured as part of creating the thermally enhance PBGA package, as can the thermally conductive epoxy that is inserted underneath the mounted semiconductor device as an underfill for that device.

In addition, for completion of the thermally enhance PBGA package, end-of-line processing can be provided, comprising steps of connecting contact balls to the first surface of the substrate 12, which completes the creation of a Plastic Ball Grid Array (PBGA) package.

The above provided comments; relating to the application of layers of (first and second) mold compound and end-of-line processing, equally applies to the cross sections of FIGS. 3 through 5 and are hereby made part of the descriptions of these cross sections that are provided below.

Element 12 in the cross sections of FIGS. 2a and 2b has been referred to as a substrate. This term is not to be interpreted in any limited sense but can be interpreted as being a semiconductor device mounting support. As semiconductor device mounting support can serve surfaces consisting of semiconductor substrates, printed circuit boards, flex circuits, metallized substrates, glass substrates and semiconductor device mounting support. The cited semiconductor substrate may be selected from the group of substrates consisting of semiconductor substrates, ceramic substrates, glass substrates, gallium arsenide substrates, silicon substrates comprising a single layer of material, such as a silicon wafer or comprising silicon on insulator (SOI) technology and silicon on sapphire (SOS) technology, doped or undoped semiconductors, epitaxial layers of silicon supported by a base semiconductor, sapphire substrates or substrates used for flat panel displays.

In the cross sections that are shown in FIGS. 2a and 2b, the standoff 42 of the heat spreader 14 is inserted into or aligned with a copper pad 44 provided over the surface of the substrate 12. The through hole 65 of the heat spreader standoff 42 allows the copper or ground pad 44 to function as a positioning guide for the positioning of the heat spreader 14 with respect to the substrate 12 over which the heat spreader 14 is mounted. The heat spreader 14 is connected to the ground pad 44 using a conductive epoxy 46 for heat spreading purposes, the thermally conductive epoxy 46 is applied using an epoxy dispensing process. A baking process cures the thermally conductive epoxy 46 in order to assure firm holding of the heat spreader 14 prior to the steps of encapsulation and molding (not From the cross sections that are shown in FIGS. 2a and 2b, it is, in sum, clear that:

the heatsink 14 is aligned with the substrate 12 by means of the copper pad 44 that is provided over the second surface of substrate 12, and the heatsink is connected to the ground pad 44 by thermally conductive epoxy 46.

Figure 3A:
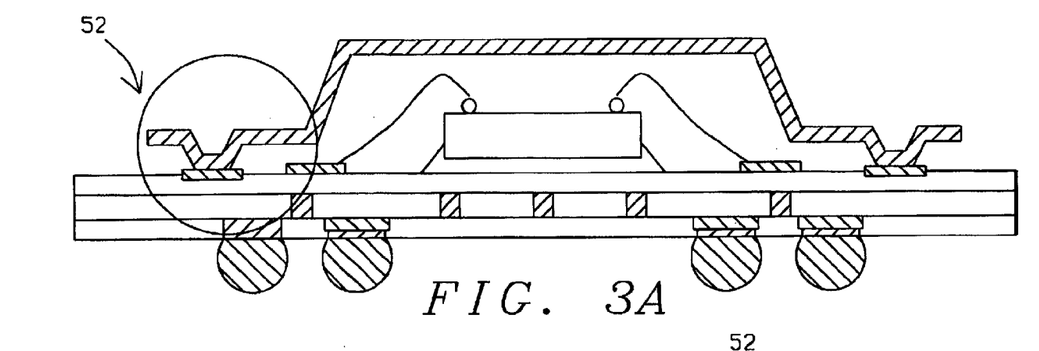
FIGS. 3a and 3b show a cross section of a second PBGA package of the invention, whereby the heat spreader is aligned with the underlying substrate of the package by means of a gold stud or bump that is created over a copper ground pad provided in the second surface of the substrate of the package.
Figure 3B:
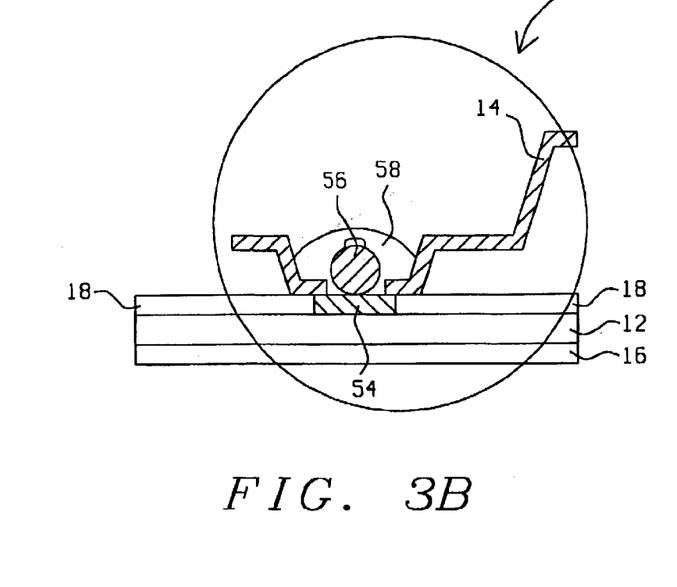

Referring now to the cross sections that are shown in FIGS. 3a and 3b, there is shown a second interconnect methodology of a thermally enhanced PBGA package 5Q. The physical interface between the heat sink 14 and the substrate 12, also referred to as the stand-off 52 of the heat spreader 14, has been shown in magnified form in order to highlight the following details 6f stand-off 52 and the interfacing with the surface 12:

54, a copper pad that is provided over a second surface of substrate 12, which penetrates through the solder mask 18 in order to establish firm mechanical interface between the heat sink 14 and substrate 12

56, a gold stud bump, created overlying and in contact with copper pad 54, and 58, conductive epoxy that has been inserted overlying a gold stud bump 56 and copper pad 54.

Additional elements that are shown in the cross sections of FIGS. 3a and 3b but that have not been individually highlighted in the cross sections of FIGS. 3a and 3b will be recognized as being identical to the corresponding elements that have previously been highlighted in the cross section of FIG. 1. Because of this partial identity between the cross sections of FIGS. 3a and 3b and FIG. 1, these elements will for reasons of avoidance of repetition and for reasons of simplicity of presentation not be repeated at this time. These elements are included in the description of the cross sections of FIGS. 3a and 3b by reference to the cross section of FIG. 1.

The cross section of the stand-off 52 of the heat spreader 14 as shown in FIGS. 3a and 3b will be recognized as being identical to the cross section of the stand-off 42 of the heat spreader 14 that has been discussed in detail in the cross sections of FIGS. 2a and 2b. Because of this identity, this detailed description will not be repeated at this time but will be included by reference in the description of the cross sections of FIGS. 3a and 3b.

In the cross sections that are shown in FIGS. 3a and 3b, the standoff of the heat spreader has a through hole, the heat spreader 14 is inserted or aligned with the underlying substrate 12 using a gold stud bump 56. The stud bump 56 will be formed applying single or multiple steps of creating overlying layers of bump material. The heat spreader 14 is connected to the ground pad 54 using the conductive epoxy 58 by a dispensing process. Curing of the conductive epoxy 53 is applied by a baking process, thus providing a firm positioning of the heat spreader 14 prior to encapsulation and molding.

From the cross sections that are shown in FIGS. 3a and 3b, it is, in sum, clear that:

the heatsink 14 is aligned with the substrate 12 by means of the gold stud bump 56 that is provided over the second surface of substrate 12 the heatsink 14 is thermally connected to the ground pad 54 by thermally conductive epoxy 58.

Figure 4A:
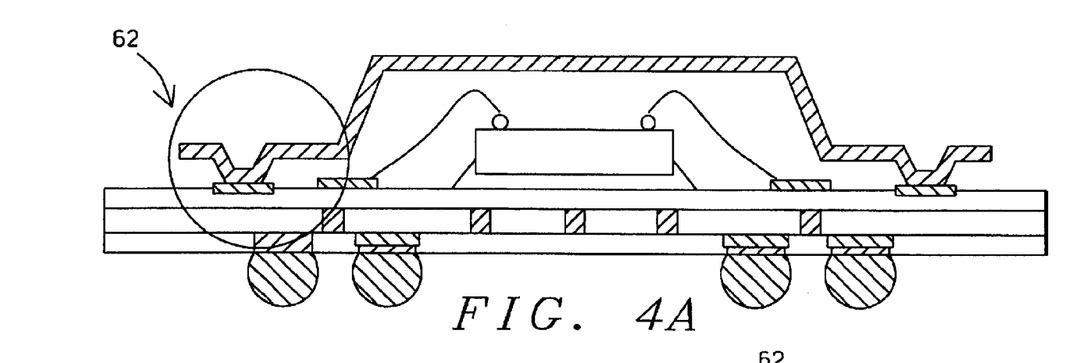
FIGS. 4a and 4b show a cross section of a third PBGA package of the invention whereby the heat spreader is aligned with the underlying substrate of the package by means of a solder ball that is created over a copper ground pad provided in the second surface of the substrate of the package.
Figure 4B:
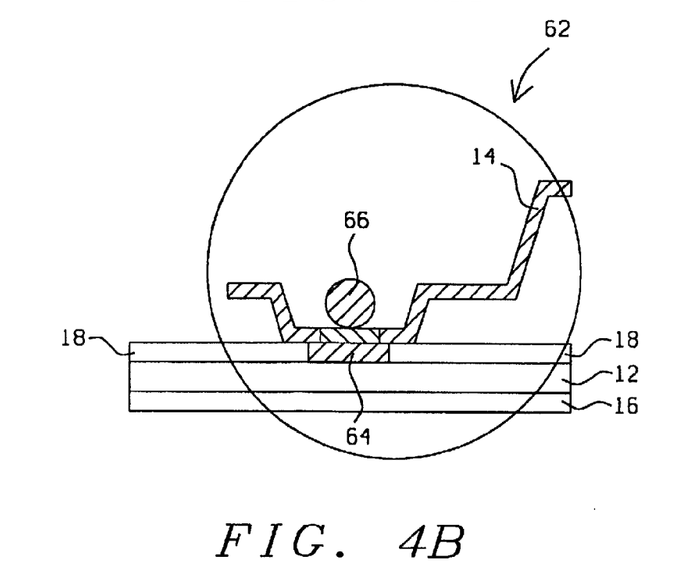

Referring to the cross sections that are shown in FIGS. 4a and 4b, there is shown a third interconnect methodology of a thermally enhanced PBGA package 60. The physical interface 62 between the heat sink 14 and the substrate 12 has been shown in magnified form in order to highlight the following details of interconnect 62:

64, a copper pad that is provided over a second surface of substrate 12, which penetrates through the solder mask 18 in order to establish firm mechanical interface between the heat sink 14 and substrate 12, and 66, a solder ball, created overlying and in contact with copper pad 64.

Additional elements that are shown in and that are part of the cross sections of FIGS. 4a and 4b but that have not been individually highlighted in the cross sections of FIGS. 4a and 4b Will be recognized as being identical to the corresponding elements that have previously been highlighted in the cross section of FIG. 1. Because of this partial identity between the cross sections of FIGS. 4a and 4b and FIG. 1, these elements will for reasons of avoidance of repetition and for reasons of simplicity of presentation not be repeated at this time. These elements are included in the description of the cross sections of FIGS. 4a and 4b by reference to the cross section of FIG. 1.

In the cross sections that are shown in FIGS. 4a and 4b, the stand off 62 of the heat spreader 14 is inserted or aligned in the pre-attached solder ball 66 or by the use of solder paste (not shown). The flux-free solder ball 66 or solder paste is attached after wire bonding. The copper ground pad 64 is connected to the heat spreader 14 by soldering or by reflow.

The cross section of the stand-off 62 of the heat spreader 14 as shown in FIGS. 4a and 4b will be recognized as being identical to the cross section of the stand-off 42 of the heat spreader 14 that has been discussed in detail in the cross sections of FIGS. 2a and 2b. Because of this identity, this detailed description will not be repeated at this time but will be included by reference in the description of the cross sections of FIGS. 4a and 4b.

From the cross sections that are shown in FIGS. 4a and 4b, it is, in sum, clear that the heatsink 14 is aligned with the substrate 12 by means of the solder ball 66 that is provided over the second surface of substrate 12. The heatsink 14 will be connected to the substrate 12 by soldering or by a process of solder reflow.

Figure 5A:
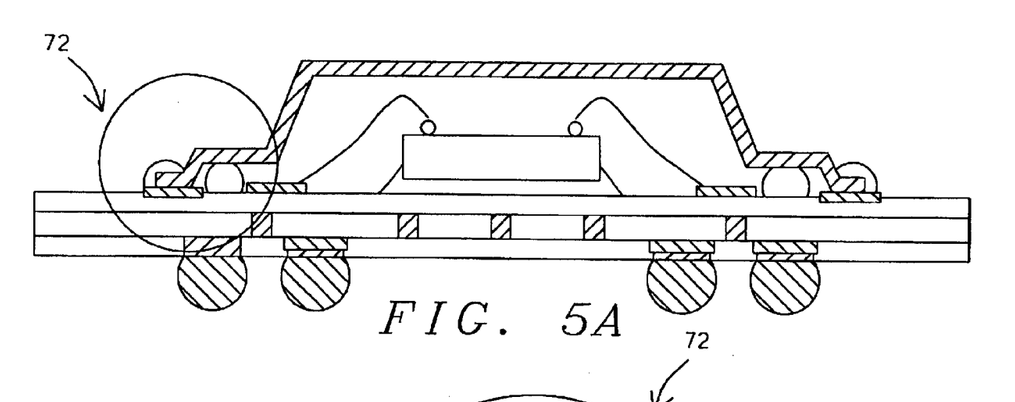
FIGS. 5a and 5b show a cross section of a fourth PBGA package of the invention, whereby the stand-off of the heat spreader is aligned with a copper ground pad provided in the second surface of the substrate of the package, thermally conductive epoxy is provided over an extremity of the stand-off of the heat spreader and the exposed surface of the copper ground pad.
Figure 5B:
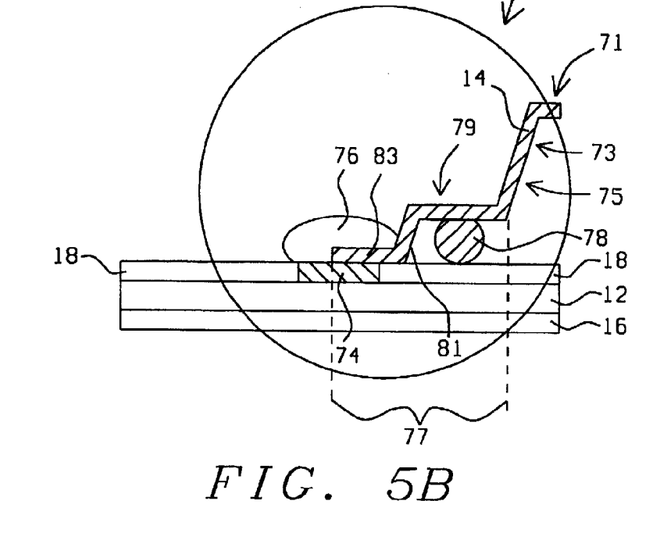

Referring to the cross sections that are shown in FIGS. 5a and 5b, there is shown a fourth interconnect methodology of a thermally enhanced PBGA package 70. The physical interface 72, referred to as the stand-off of the heat spreader 14, between the heat sink 14 and the substrate 12 has been shown in magnified form in order to highlight the following details of interconnect 52:

74, a copper pad that is provided over a second surface of substrate 12, which penetrates through the solder mask 18 in order to establish firm mechanical interface between the heat sink 14 and substrate 12, and 76, conductive epoxy that has been provided overlying the copper pad 74.

The separate elements of the standoff 72 of the heat spreader shown in cross sections in FIGS. 5a and 5b are the 71, a horizontal section of the heat spreader 14

73, an upper section of the stand-off section 42 of the heat spreader 14

75, a center section of the stand-off section 42 of the heat spreader 14

77, a lower section of the stand-off section 72 of the heat spreader 14, the lower section 77 of the heat spreader stand-off 72 comprises, progressing in a direction away from the horizontal section 71 of the heat spreader 14:

79, a first horizontal section being parallel with the surface of the substrate 12, followed by 81, a center section, interfacing with the surface of the substrate 12 under an angle, followed by 83, a second horizontal section being connected to the center section 81, the second horizontal section 83 being parallel with the surface of the substrate 12; further shown in the cross sections of FIGS. 5a and 5a is element 78, which is a heat spreader stand-off ball or stud that is physically connected to or part of the heat spreader 14 and that provides additional stability to the interconnect between the heat spreader 14 and the substrate 12.

Additional elements that are shown in and that are part of the cross sections of FIGS. 5a and 5b but that have not been individually highlighted in the cross sections of FIGS. 5a and 5b Will be recognized as being identical with the corresponding elements that have previously been highlighted in the cross section of FIG. 1. Because of this partial identity between the cross sections of FIGS. 5a and 5b and FIG. 1, these elements will for reasons of avoidance of repetition and for reasons of simplicity of presentation not be repeated at this time. These elements are included in the description of the cross sections of FIGS. 5a and 5b by reference to the cross section of FIG. 1.

In the cross sections that are shown in FIGS. 5a and 5b, the pedestal or foot 83 of the heat spreader is positioned on the ground pad 74 provided over the surface of the substrate 12. For improved conductivity, a thermally conductive epoxy 76 is dispensed over the foot 83 and ground pad 74, followed by a curing process to firmly hold the heat spreader 14 in place. A heat spreader stand-off ball or stud 78 is part of the heat spreader 14 in order to maintain improved planarity of the heat spreader 14 with respect to the surface of the substrate 12.

From the cross sections that are shown in FIGS. 5a and 5b, it is, in sum, clear that the heatsink 14 is thermally connected to the ground pad 74 by thermally conductive epoxy 76. In addition, the heat spreader 14 is provided with a heat spreader standoff ball or stud 78, which provides for firm mechanical interfacing between the heat spreader 14 and the second surface of substrate 12.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. A method for packaging a semiconductor device, forming a Plastic Ball Grid Array (PBGA) package, comprising the steps of:

(A) providing a semiconductor device mounting support having a first and a second surface, said semiconductor device mounting support having been provided with interconnect traces and at least one metal pad therein or thereover;

(B) mounting at least one semiconductor device over the second surface of said semiconductor device mounting support;

(C) connecting said at least one semiconductor device in a face upward position by facing an active surface of said at least one semiconductor device away from said semiconductor device mounting support, using interconnect wires between said interconnect traces provided in said semiconductor device mounting support and contact points provided in an active surface of said at least one semiconductor device;

(D) positioning a heat spreader over the surface of said substrate, said heat spreader comprising:

(a) a horizontal section being parallel with a semiconductor device mounting support over which said heat spreader is being mounted, said horizontal section having a perimeter;

(b) heat spreader stand-off sections extending from said perimeter of said horizontal section, a lower section of said heat spreader stand-off sections forming a physical interface between said heat spreader and said semiconductor device mounting support over which said heat spreader is being mounted;

(c) each of said heat spreader standoff sections comprising:

(i) an upper section being connected to said horizontal section of said heat spreader under an angle (ii) a center section being connected with said upper section in a plane of said upper section, and (iii) said lower section being connected with said center section of said heat spreader standoff section;

(d) each lower section of each of said heat spreader standoff sections comprising:

(i) a first horizontal section being parallel with the surface of said semiconductor device mounting support, said first horizontal section being connected with said lower section of said heat spreader stand-off section;

(ii) a U-shaped extrusion connected with said first horizontal section, with a lower side of said U-shaped extrusion facing said semiconductor device mounting support, with two remaining sides of said U-shaped extrusion interfacing with the surface of said semiconductor device mounting support under an angle, with at least one opening having been created through said lower side of said U-shaped extrusion; and (iii) a second horizontal section connected to said U-shaped extrusion; and (E) having mounted and interconnected at least one semiconductor device, further creating a mold compound overlying at least part of said heat spreader.

2. The method of claim 1, additionally curing said mold compound and said thermally conductive epoxy.

3. The method of claim 1, said heat spreader comprising metal.

4. The method of claim 1, said heat spreader comprising thermally conductive epoxy.

5. The method of claim 1, in addition providing end-of-line processing for said packaging of said semiconductor device, said end-of-line processing comprising steps of connecting contact balls to the first surface of said semiconductor device mounting support, completing creation of a thermally enhanced Plastic Ball Grid Array (PBGA) package.

6. The method of claim 1, additionally comprising the steps of:

aligning said at least one metal pad with said at least one opening created through said lower side of said U-shaped extrusion;

inserting said at least one metal pad into said at least one opening created through said lower side of said U-shaped extrusion; and supplying thermally conductive epoxy over the surface of said at least one metal pad, thereby at least overlying said lower side of said U-shaped extrusion with a layer of said thermally conductive epoxy.

7. The method of claim 1, said at least one metal pad comprising copper.

8. The method of claim 1, said at least one metal pad serving as ground pad.

9. A method for packaging a semiconductor device, forming a Plastic Ball Grid Array (PBGA) package, comprising the steps of:

(A) providing a semiconductor device mounting support having a first and a second surface, said semiconductor device mounting support having been provided with interconnect traces and at least one metal pad therein or thereover, a stud bump having been provided over the surface of said at least one metal pad;

(B) mounting at least one semiconductor device over the second surface of said semiconductor device mounting support;

(C) connecting said at least one semiconductor device in a face upward position by facing an active surface of said at least one semiconductor device away from said semiconductor device mounting support, using interconnect wires between said interconnect traces provided in said semiconductor device mounting support and contact points provided in an active surface of said at least one semiconductor device;

(D) positioning a heat spreader over the surface of said semiconductor mounting support, said heat spreader comprising:

(a) a horizontal section being parallel with a semiconductor device mounting support over which said heat spreader is being mounted, said horizontal section having a perimeter;

(b) heat spreader stand-off sections extending from said perimeter of said horizontal section, a lower section of said heat spreader stand-off sections forming a physical interface between said heat spreader and said semiconductor device mounting support over which said heat spreader is being mounted;
  (c) each of said heat spreader standoff sections comprising:
    (i) an upper section being connected to said horizontal section of said heat spreader under an angle
    (ii) a center section being connected with said upper section in a plane of said upper section, and
    (iii) said lower section being connected with said center section of said heat spreader standoff section;
  (d) each lower section of each of said heat spreader standoff sections comprising:
    (i) a first horizontal section being parallel with the surface of said semiconductor device mounting support, said first horizontal section being connected with said lower section of said heat spreader stand-off section;
    (ii) a U-shaped extrusion connected with said first horizontal section, with a lower side of said U-shaped extrusion facing said semiconductor device mounting support, with two remaining sides of said U-shaped extrusion interfacing with the surface of said semiconductor device mounting support under an angle, with at least one opening having been created through said lower side of said U-shaped extrusion; and
    (iii) a second horizontal section connected to said U-shaped extrusion; and
  (E) mounting and interconnecting at least one semiconductor device, further creating mold compound overlying at least part of said heat spreader.

10. The method of claim 9, additionally curing said mold compound and said thermally conductive epoxy.

11. The method of claim 9, said heat spreader comprising metal.

12. The method of claim 9, said heat spreader comprising thermally conductive epoxy.

13. The method of claim 9, in addition providing end-of-line processing for said packaging of said semiconductor device, said end-of-line processing comprising steps of connecting contact balls to the first surface of said semiconductor device mounting support, completing creation of a thermally enhanced Plastic Ball Grid Array (PBGA) package.

14. The method of claim 9, additionally comprising the steps of:
  aligning said stud bump provided over the surface of said at least one metal pad with said at least one opening created through said lower side of said U-shaped extrusion;
  inserting said at least one stud bump into said at least one opening created through said lower side of said U-shaped extrusion; and
  supplying thermally conductive epoxy or solder paste over the surface of said at least one metal pad, thereby at least overlying said stud bump and further at least overlying said lower side of said U-shaped extrusion with a layer of said thermally conductive epoxy or solder paste.

15. The method of claim 9, said at least one metal pad comprising copper.

16. The method of claim 9, said at least one metal pad serving as ground pad.

17. The method of claim 9, said stud bump comprising gold.

18. The method of claim 9, said heat spreader comprising solder paste.

19. The method of claim 9, said stud bump comprising copper.

20. A method for packaging a semiconductor device, forming a Plastic Ball Grid Array (PBGA) package, comprising the steps of:
  (A) providing a semiconductor device mounting support having a first and a second surface, said semiconductor device mounting support having been provided with interconnect traces and at least one metal pad therein or thereover, a solder bump having been provided over the surface of said at least one metal pad;
  (B) mounting at least one semiconductor device over the second surface of said semiconductor device mounting support;
  (C) connecting said at least one semiconductor device in a face upward position by facing an active surface of said at least one semiconductor device away from said semiconductor device mounting support, using interconnect wires between said interconnect traces provided in said semiconductor device mounting support and contact points provided in an active surface of said at least one semiconductor device;
  (D) positioning a heat spreader over the surface of said semiconductor mounting support, said heat spreader comprising:
    (a) a horizontal section being parallel with a semiconductor device mounting support over which said heat spreader is being mounted, said horizontal section having a perimeter;
    (b) heat spreader stand-off sections extending from said perimeter of said horizontal section, a lower section of said heat spreader stand-off sections forming a physical interface between said heat spreader and said semiconductor device mounting support over which said heat spreader is being mounted;
    (c) each of said heat spreader standoff sections comprising:
      (i) an upper section being connected to said horizontal section of said heat spreader under an angle
      (ii) a center section being connected with said upper section in a plane of said upper section, and
      (iii) said lower section being connected with said center section of said heat spreader standoff section;
    (d) each lower section of each of said heat spreader standoff sections comprising:
      (i) a first horizontal section being parallel with the surface of said semiconductor device mounting support, said first horizontal section being connected with said lower section of said heat spreader stand-off section;
      (ii) a U-shaped extrusion connected with said first horizontal section, with a lower side of said U-shaped extrusion facing said semiconductor device mounting support, with two remaining sides of said U-shaped extrusion interfacing with the surface of said semiconductor device mounting support under an angle, with at least one opening having been created through said lower side of said U-shaped extrusion; and
      (iii) a second horizontal section connected to said U-shaped extrusion; and
  (E) mounting and interconnecting at least one semiconductor device, further creating mold compound overlying at least part of said heat spreader.

21. The method of claim 20, additionally curing said mold compound and said thermally conductive epoxy.

22. The method of claim 20, said heat spreader comprising metal.

23. The method of claim 20, said heat spreader comprising thermally conductive epoxy.

24. The method of claim 20, in addition providing end-of-line processing for said packaging of said semiconductor device, said end-of-line processing comprising steps of connecting contact balls to the first surface of said semiconductor device mounting support, completing creation of a thermally enhanced Plastic Ball Grid Array (PBGA) package.

25. The method of claim 20, additionally comprising the steps of:

aligning said solder bump provided over the surface of said at least one metal pad with said at least one opening created through said lower side of said U-shaped extrusion; and inserting said at least one solder bump into said at least one opening created through said lower side of said U-shaped extrusion.

26. The method of claim 20, said at least one metal pad comprising copper.

27. The method of claim 20, said at least one metal pad serving as ground pad.

28. The method of claim 20, said heat spreader comprising solder paste.

29. A method for packaging a semiconductor device, forming a Plastic Ball Grid Array (PBGA) package, comprising the steps of:

(A) providing a semiconductor device mounting support having a first and a second surface, said semiconductor device mounting support having been provided with interconnect traces and at least one metal pad therein or thereover, a solder bump having been provided over the surface of said at least one metal pad;

(B) mounting at least one semiconductor device over the second surface of said semiconductor device mounting support;

(C) connecting said at least one semiconductor device in a face upward position by facing an active surface of said at least one semiconductor device away from said semiconductor device mounting support, using interconnect wires between said interconnect traces provided in said semiconductor device mounting support and contact points provided in an active surface of said at least one semiconductor device;

(D) positioning a heat spreader over the surface of said semiconductor device mounting support, said heat spreader comprising:

(a) a horizontal section being parallel with a semiconductor device mounting support over which said heat spreader is being mounted, said horizontal section having extremities around a perimeter thereof;

(b) heat spreader stand-off sections extending from said perimeter of said horizontal section, a second horizontal section of a lower section of said heat spreader stand-off sections forming a physical interface between said heat spreader and said semiconductor device mounting support;

(c) each of said heat spreader standoff sections comprising:

(i) an upper section being connected to said horizontal section of said heat spreader under an angle;

(ii) a first center section being connected with said upper section of said heat spreader standoff section in a plane of said upper section;

(iii) a lower section being connected with said first center section of said heat spreader stand-off section, said lower section comprising:

(1) a first horizontal section connected with said lower section, said first horizontal section being parallel with the surface of said semiconductor device mounting support;

(2) a second center section intersecting connected with said first horizontal section, said second center section intersecting the surface of said semiconductor device mounting support under an angle;

(3) said second horizontal section connected to said second center section; and (4) an essentially spherically shaped supportive metal interface between said first horizontal section of said lower section of said heat spreader stand-off section and the surface of said semiconductor device mounting support as a physical extension of said first horizontal section; and (E) mounting and interconnecting at least one semiconductor device, further creating mold compound overlying at least part of said heat spreader.

30. The method of claim 29, additionally curing said mold compound and said thermally conductive epoxy.

31. The method of claim 29, said heat spreader comprising metal.

32. The method of claim 29, said heat spreader comprising thermally conductive epoxy.

33. The method of claim 29, in addition providing end-of-line processing for said packaging of said semiconductor device, said end-of-line processing comprising steps of connecting contact balls to the first surface of said semiconductor device mounting support, completing creation of a thermally enhanced Plastic Ball Grid Array (PBGA) package.

34. The method of claim 29, additionally comprising the steps of:

aligning said at least one metal pad with said second horizontal section of said lower section thereby positioning said second horizontal section of said lower section over said at least one metal pad by a first measurable amount, exposing the surface of said at least one metal pad by a second measurable amount; and providing at least one supply of thermally conductive epoxy over the surface of said second horizontal section of said lower section, thereby including the exposed surface of said at least one metal pad provided in a second surface of said semiconductor device mounting support.

35. The method of claim 29, said at least one metal pad comprising copper.

36. The method of claim 29, said at least one metal pad serving as ground pad.

* * * * *

UNITED STATES PATENT AND TRADEMARK OFFICE
CERTIFICATE OF CORRECTION

PATENT NO. : 6,706,563 B2
DATED : March 16, 2004
INVENTOR(S) : Shim et al.

It is certified that error appears in the above-identified patent and that said Letters Patent is hereby corrected as shown below:

Column 1,
Line 17, at the end of the sentence insert -- density. --
Line 20, delete "flat" and insert therefore -- Flat --
Line 67, delete "5,372,396" and insert therefore -- 5,872,396 --

Column 2,
Line 6, insert the section heading -- SUMMARY OF THE INVENTION --

Column 4,
Line 25, delete "23"" and insert therefore -- 28" --

Column 5,
Line 57, at the end of the sentence insert -- applied. --

Column 6,
Line 1, delete "comments;" and insert therefore -- comments, --
Line 36, delete "(notFrom" and insert therefore -- (not shown).¶ -- And then begin new paragraph -- From --
Line 46, delete "5Q" and insert therefore -- 50 --
Line 50, delete "6f" and insert therefore -- of --

Column 7,
Line 20, delete "53" and insert therefore -- 58 --
Line 45, delete "Will" and insert therefore -- will --

UNITED STATES PATENT AND TRADEMARK OFFICE
CERTIFICATE OF CORRECTION

PATENT NO. : 6,706,563 B2
DATED : March 16, 2004
INVENTOR(S) : Shim et al.

It is certified that error appears in the above-identified patent and that said Letters Patent is hereby corrected as shown below:

Column 8,
Line 21, at the end of the clause insert -- following: --
Line 38, delete the second occurance of "$5a$" and insert therefore -- $5b$ --
Line 47, delete "Will" and insert therefore -- will --

Signed and Sealed this

Twenty-second Day of March, 2005

JON W. DUDAS
*Director of the United States Patent and Trademark Office*